(12) United States Patent
Mateman et al.

(10) Patent No.: US 8,548,111 B2
(45) Date of Patent: Oct. 1, 2013

(54) SAMPLER CIRCUIT

(75) Inventors: Paul Mateman, Millingen aan de Rijn (NL); Johannes Petrus Antonius Frambach, Nijmegen (NL)

(73) Assignee: ST-Ericsson-SA, Plan-les-Ouates (CH)

( * ) Notice: Subject to any disclaimer, the term of this patent is extended or adjusted under 35 U.S.C. 154(b) by 245 days.

(21) Appl. No.: 13/198,401

(22) Filed: Aug. 4, 2011

(65) Prior Publication Data

US 2012/0082280 A1 Apr. 5, 2012

Related U.S. Application Data

(60) Provisional application No. 61/388,302, filed on Sep. 30, 2010.

(51) Int. Cl.
*H04L 7/02* (2006.01)
(52) U.S. Cl.
USPC .......................................... 375/360; 375/371
(58) Field of Classification Search
USPC .................. 375/360, 372, 375, 376, 294, 327
See application file for complete search history.

(56) References Cited

U.S. PATENT DOCUMENTS

| | | | |
|---|---|---|---|
| 5,825,253 | A | 10/1998 | Mathe et al. |
| 5,937,020 | A | 8/1999 | Hase et al. |
| 6,421,404 | B1 | 7/2002 | Nakamura |
| 6,690,215 | B2 | 2/2004 | McCune, Jr. et al. |
| 7,230,458 | B2 | 6/2007 | DaDalt |
| 7,750,742 | B2 | 7/2010 | Cho et al. |
| 7,777,576 | B2 | 8/2010 | Waheed et al. |
| 7,782,927 | B2 | 8/2010 | Börker et al. |
| 2005/0186920 | A1 | 8/2005 | Staszewski et al. |
| 2006/0044022 | A1* | 3/2006 | Tayler et al. ................... 327/24 |
| 2007/0096833 | A1 | 5/2007 | Maurer et al. |
| 2008/0315928 | A1 | 12/2008 | Waheed et al. |
| 2010/0019800 | A1 | 1/2010 | Wang et al. |
| 2010/0141316 | A1 | 6/2010 | Weltin-Wu et al. |
| 2011/0309865 | A1* | 12/2011 | Cordos .......................... 327/153 |

FOREIGN PATENT DOCUMENTS

JP 7038910 A 2/1995

OTHER PUBLICATIONS

Staszewski et al. "All-Digital Frequency Synthesizer in Deep-Submicron CMOS." Copyright 2006, pp. 1-261, John Wiley & Sons, Inc., Hoboken, New Jersey.
Nenad Pavlovic et al. "A 5.3GHz Digital-to-Time-Converter-Based Fractional-N All-Digital PLL." 2011 IEEE International Solid-State Circuits Conference, Feb. 21, 2011, pp. 54-56, ISSCC 2011 / Session 3/ RF Techniques / 3.2.
Chung et al. "A High Resolution Metastability-Independent Two-Step Gated Ring Oscillator TDC with Enhanced Noise Shaping." Proceedings of 2010 IEEE International Symposium on Circuits and Systems (ISCAS), May 30, 2010, pp. 1300-1303.

* cited by examiner

*Primary Examiner* — Emmanuel Bayard
(74) *Attorney, Agent, or Firm* — Coats & Bennett, P.L.L.C.

(57) ABSTRACT

A sampler circuit comprises a plurality of series-connected sampler cells and a detector circuit. Each successive stage comprises twice the number of sampler cells, in parallel, as the previous stage, and is clocked at half the sampling frequency of the previous stage. Each sampler cell comprises two parallel branches of series-connected clocked inverters. A clocked inverter is operative to invert an applied signal during one phase of an applied sampling clock, and to render a high impedance output during the other sampling clock phase. Successive clocked inverters are clocked with opposite (i.e., positive/negative) versions of the sampling clock. The detector circuit examines the outputs of the last stage of sampler cells, and may for example comprise an OR function to detect a state transition in an applied input signal. The sampler circuit exhibits immunity to metastability and low power consumption.

13 Claims, 11 Drawing Sheets

SAMPLER CIRCUIT

This application claims priority to U.S. Provisional Patent Application Ser. No. 61/388,302, filed Sep. 30, 2010, titled, "Reference Clock Sampler Circuit for Digital PLL," the disclosure of which is incorporated herein by reference in its entirety. Co-pending U.S. patent application Ser. No. 13/198,389, titled "Reference Clock Sampling Digital PLL," assigned to the assignee of this application and filed concurrently herewith, is incorporated herein by reference in its entirety.

TECHNICAL FIELD

The present invention relates generally to sampling circuits, and in particular to a clocked inverter sampler circuit that substantially eliminates meta-stability.

BACKGROUND

Sampler circuits are circuits that ascertain the state of an applied signal by rapidly quantizing, or sampling, the signal and processing the samples as being representative of one or more features of the sampled signal. In some applications, sampler circuits may only be required to ascertain specific features of an applied signal, such as the timing of state transitions for a periodic signal such as a digital clock signal.

A Phase Locked Loop (PLL) is a well-known circuit for deriving a steady (sometimes changeable or tunable) high frequency output signal. PLL are widely used in communication circuits, such as for generating carrier and local oscillator frequency signals for the modulation and demodulation of radio communication signals. PLLs compare a divided Radio Frequency (RF) signal with a reference clock to achieve phase lock, thus stabilizing the frequency of the undivided RF output. FIG. 11 depicts a functional block diagram of a conventional analog PLL. A Phase Frequency Detector (PFD) 12 compares the phases of a reference clock from a precision source 14, such as a crystal oscillator, to a feedback signal from a divider 16. The divider 16 divides down an RF output signal to the PLL operating frequency. The PFD 12 converts the phase difference between the reference clock and the divided RF signal into a control voltage level output. The PDF 12 output is low-pass filtered by a filter 18, and the control voltage is input to a Voltage Controlled Oscillator (VCO) 19 that changes the frequency of an RF output signal in response to the control voltage level.

Recently, digital PLL architectures have evolved, in which the phase difference is measured in a quantized fashion and converted into a digital control code for a Digitally Controlled Oscillator (DCO). A digital phase detector measures the phase difference. Prior art digital phase detectors are susceptible to meta-stability problems due to the asynchronous relationship between the sampling clock and the sampled reference clock. Furthermore, known digital phase detectors are not very sensitive, and they suffer from hysteresis and dead-zone/dead-time, due to regenerative gain.

SUMMARY

According to one or more embodiments described and claimed herein, a sampler circuit comprises a plurality of series-connected sampler cells and a detector circuit. Each successive stage comprises twice the number of sampler cells, in parallel, as the previous stage, and is clocked at half the sampling frequency of the previous stage. Each sampler cell comprises two parallel branches of series-connected clocked inverters. A clocked inverter is operative to invert an applied signal during one phase of an applied sampling clock, and to render a high impedance output during the other sampling clock phase. Successive clocked inverters are clocked with opposite (i.e., positive/negative) versions of the sampling clock. In this arrangement, each clocked inverter operates as a Sample & Hold circuit with gain, wherein the holding capacitor is the input capacitance of the next inverter. The clocked inverters may also be considered transparent latches with inverting outputs, from which functional flip-flops may be constructed. The detector circuit examines the outputs of the last stage of sampler cells, and may for example comprise an OR function to detect a state transition in an applied input signal. The sampler circuit exhibits immunity to metastability and low power consumption. The sampler circuit may find particular utility sampling the reference clock of a digital phase locked loop using a digitally controlled oscillator output as a sampling clock.

One embodiment relates to a sampler circuit operative to detect one or more transition edges of an input signal applied to the sampler circuit. The sampler circuit includes a signal input, a sampling clock input, and one or more serially-connected stages of sampler cells. Each sampler cell comprises two parallel branches of series-connected clocked inverters. Each clocked inverter is operative to output an inverted representation of an input applied to the clocked inverter during one phase of a sampling clock, and is further operative to render a high impedance at its output during the other phase of the sampling clock. The clocked inverters in each branch are alternatively clocked by the sampling clock and an inverted sampling clock. Each sampler cell is operative to sample a signal applied to the input of the sampler cell at a frequency determined by the sampling clock, and to output two parallel streams of samples at half the sampling clock frequency, the samples in each stream being de-multiplexed from the input signal. The sampler circuit also includes a detector circuit operative to detect, from the outputs of the last sampler cells in the serially-connected stages of sampler cells, one or more transition edges of a signal applied to the sampler cell input.

Another embodiment relates to a method of detecting a transition edge of an input signal applied to a sampling circuit. An input signal applied to the sampler circuit and a sampling clock signal are accepted. The input signal applied to the sampler circuit is sampled with one or more serially-connected stages of sampler cells. Each serially-connected stage of sampler cells comprises two parallel branches of series-connected clocked inverters. Each clocked inverter is operative to output an inverted representation of an input applied to the clocked inverter during one phase of a sampling clock, and is further operative to render a high impedance at its output during the other phase of the sampling clock. Each sampler cell is operative to sample a signal applied to the input of the sampler cell at a frequency determined by a sampling clock and is further operative to output two parallel streams of samples at half the sampling clock frequency. The samples in each stream are de-multiplexed from the input signal. One or more transition edges of the input signal applied to the sampler circuit are detected from the outputs of the last sampler cells in the serially-connected stages of sampler cells.

DETAILED DESCRIPTION

In a DPLL, the reference clock and the DCO output are asynchronous with respect to each other. In fact, the two signals are only locked to each other by the DPLL corrective actions. Accordingly, sampling the reference clock with a clock derived from the DCO output raises significant meta-stability concerns. The phase difference between the two clocks is continuously changing. When the phase difference approaches 0, there exists a brief duration in which it is unclear if the sampled value is logic-0 or logic-1. In practical implementations, this duration is actually a small time window, for which the correct level of the sampled signal cannot be resolved properly. This is known as the meta-stability window.

Most sampler circuits employ some form of regenerative feedback to derive a logic-0 or logic-1 level from the sampled input signal. The speed of the regenerative circuit to resolve the input signal to logic-0 or logic-1 depends exponentially on the magnitude of the input signal. If the input signal is sampled near its zero-crossing (phase difference is 0), the regenerative circuit can take an inordinate amount of time to reach the steady state (logic-0 or logic-1). If the sampling circuit output is unresolved, the DPLL can freeze completely. Hence, meta-stability must be avoided at all cost. Many circuit implementations are published to reduce the meta-stability window; none is known that avoids the meta-stability altogether.

Figure 1:
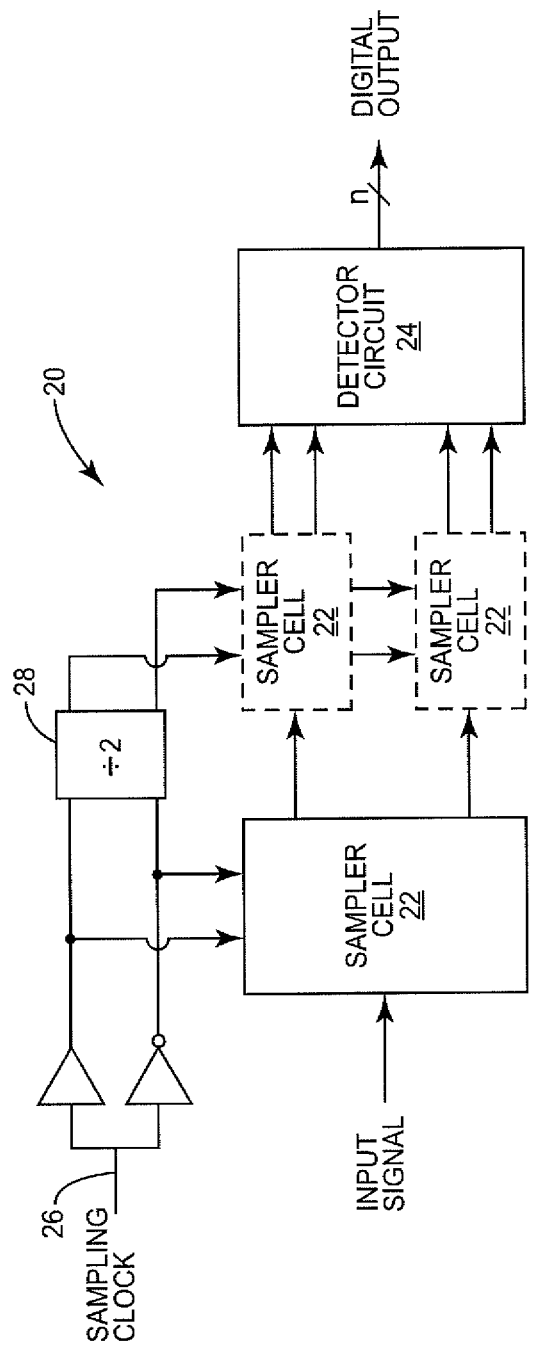
FIG. 1 is a functional schematic diagram of a sampler circuit according to one embodiment of the present invention.

Sampler circuits according to embodiments of the present invention substantially eliminate meta-stability concerns, by design. FIG. 1 depicts one embodiment of an inventive sampler circuit 20. The sampler circuit 20 includes one or more serially-connected stages of sampler cells 22 and a detector circuit 24. The sampler circuit 20 detects state transitions in the input signal, which may for example comprise a reference frequency clock signal. The sampler circuit 20 outputs, in general, an n-bit digital word describing state transitions in the input signal—for example, a quantized representation of the input signal, or a period count.

Each sampler cell 22 samples its input signal at a frequency determined by a sampling clock 26, and outputs two parallel streams of samples at half the sampling clock frequency. As will be more fully explained herein, the samples in each stream represent alternately interleaved values of the input signal. The sampling clock 26 may comprise a DCO output or a divided DCO output. As depicted, each sampler cell receives both the sampling clock and its inverse—that is, the sampling clock 26 is a balanced signal having matched positive and negative components (i.e., 180° out of phase), referred to herein as CKP and CKN, respectively. Since each sampler cell 22 outputs two parallel streams of samples at half the sampling clock frequency, each successive stage of serially-connected sampler cells 22 in the sampler circuit 20 comprises twice the number of sampler cells 22 (arranged in parallel in each stage) as the prior stage. Accordingly, the sampler cells 22 each successive stage are clocked at half the sampling clock frequency as the prior stage, as indicated in FIG. 1 by the clock divider circuit 28. In general, the sampler cell 22 may include any number of stages of serially-connected sampler cells 22.

The detector circuit 24 detects one or more state transitions of the input signal from the outputs of the last stage of sampler cells 22. The output of the detector circuit 24 is an n-bit digital word containing information regarding the state transition(s) of the sampler circuit 20 input signal. The detector circuit 24 may comprise logic gates, or may simply comprise a re-ordering of the outputs of the last stage of sampler cells 22. The configuration and operation of the detector circuit 24, and the content and format of the n-bit digital output, in various embodiments, will be clear to those of skill in the art following an explanation of the construction and operation of the sampler cells 22.

Figure 2:
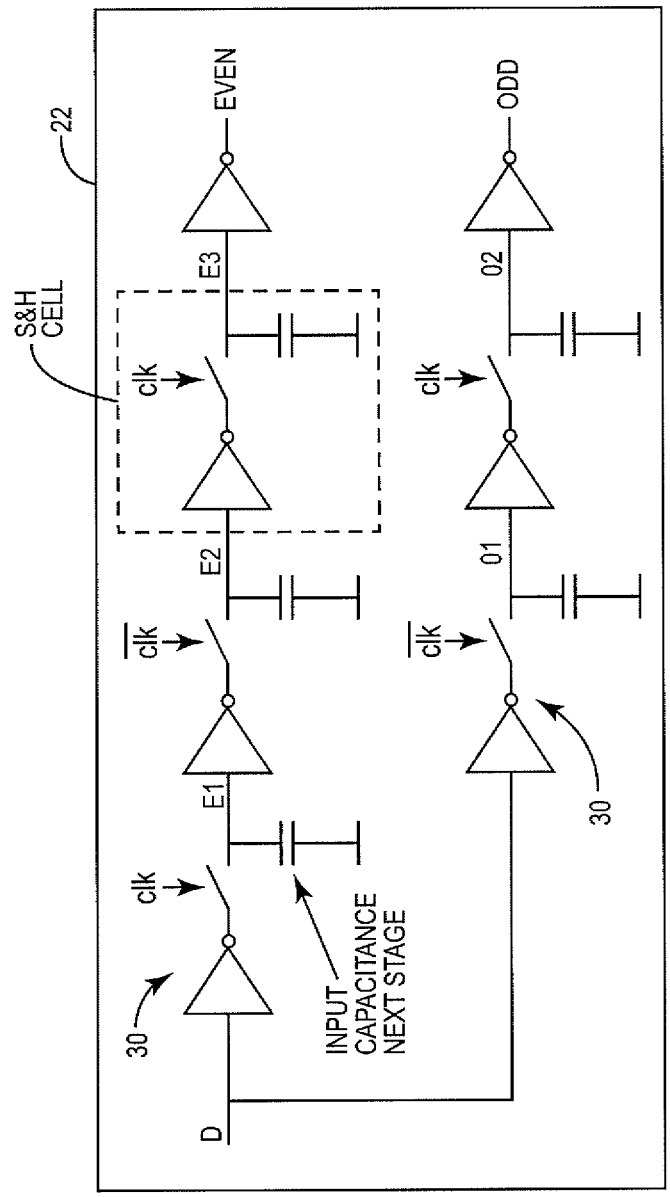
FIG. 2 is a functional block diagram of a sampler cell.

FIG. 2 depicts a functional diagram of a sampler cell 22. The sampler cell 22 comprises two parallel branches, each comprising series-connected clocked inverters 30. The clocked inverters 30 in each branch are alternatively clocked by the positive and negative sampling clock 26. As used herein, the term "clocked inverter" 30 refers to a circuit that outputs an inverted representation of an applied input during one state of an applied sampling clock, and renders a high impedance, or "tri-state," at its output during the other state of the sampling clock. When serially connected as depicted in FIG. 1, each clocked inverter 30, together with the input capacitance of its successive circuit (e.g., another inverter), operates as a sample-and-hold (S&H) cell with gain. The clocked inverter 30 portion provides gain during its inverter operation (i.e., during the operative phase of the applied sampling clock), and the input capacitance of the following inverter acts as the S&H cell hold capacitor. Assuming a modern CMOS process and a gain of 10× per inverter, serially connecting five clocked inverters realizes a gain of 100,000×. This is sufficient to produce a rail-to-rail signal (e.g., a fully saturated logic-0 or logic-1) by applying one electron on the input of the first clocked inverter.

Figure 3:
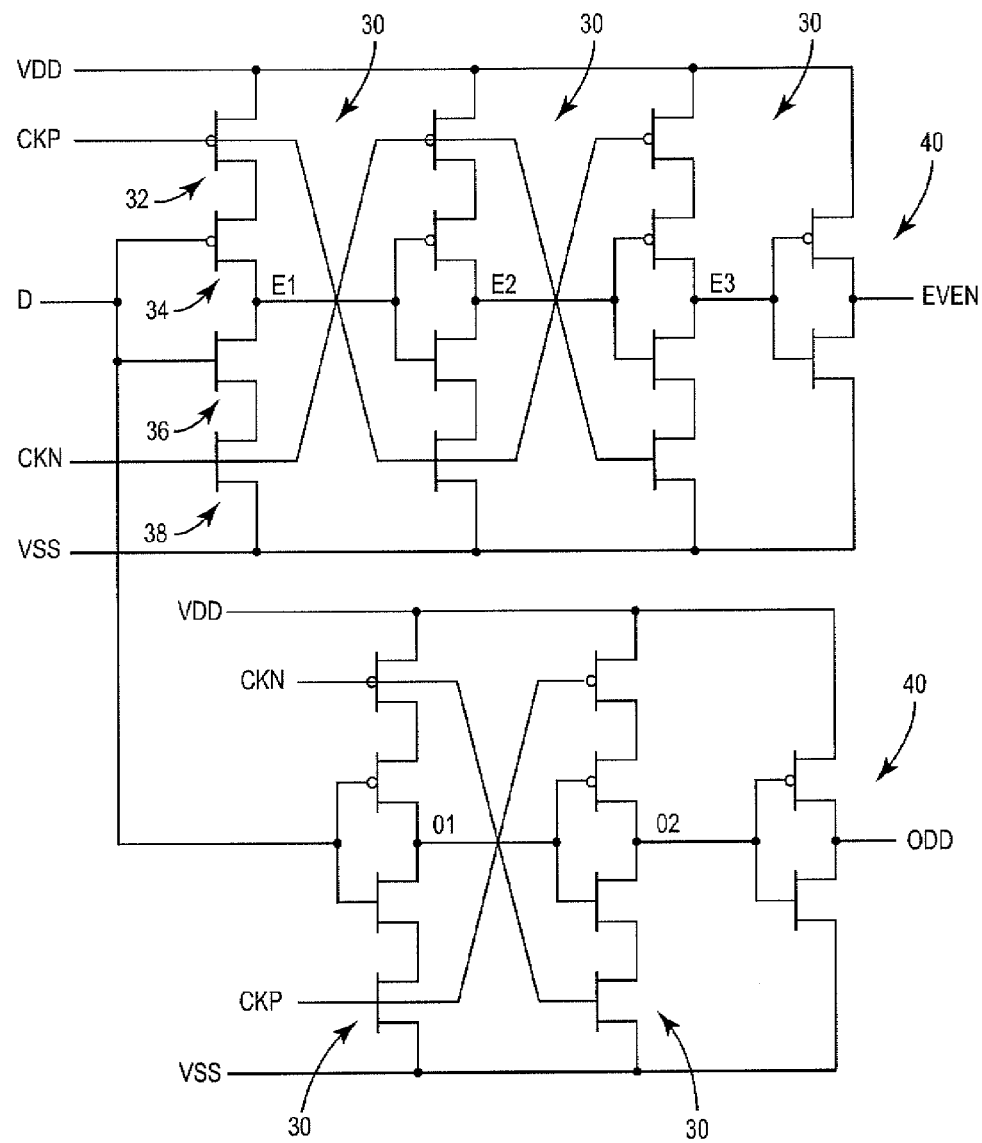
FIG. 3 is a functional schematic diagram of a sampler cell.

FIG. 3 depicts one embodiment of the sampler cell 22 of FIG. 2, implemented in CMOS. Each clocked inverter 30 comprises four MOS transistors 32, 34, 36, 38 connected in series between the supply and ground rails—two PMOS transistors 32, 34 and two NMOS transistors 36, 38. The input is connected to the gates of one PMOS transistor 34 and NMOS transistor 36, forming a conventional inverter. A positive sampling clock signal CKP is connected to the gate of one PMOS transistor 32, and a negative sampling clock signal CKN is connected to the gate of a NMOS transistor 38, both in series with the inverter formed by transistors 34, 36. During the first phase of a clock period, when CKP is high and CKN is low, the transistors 32, 38 isolate the inverter transistors 34, 36 from the supply rails, and the output E1 is at a high impedance. During the second phase of the clock period, when CKP is low and CKN is high, the transistors 32, 38 conduct, and the transistors 34, 36 invert and amplify the state of the signal present at their gates.

Figure 4:
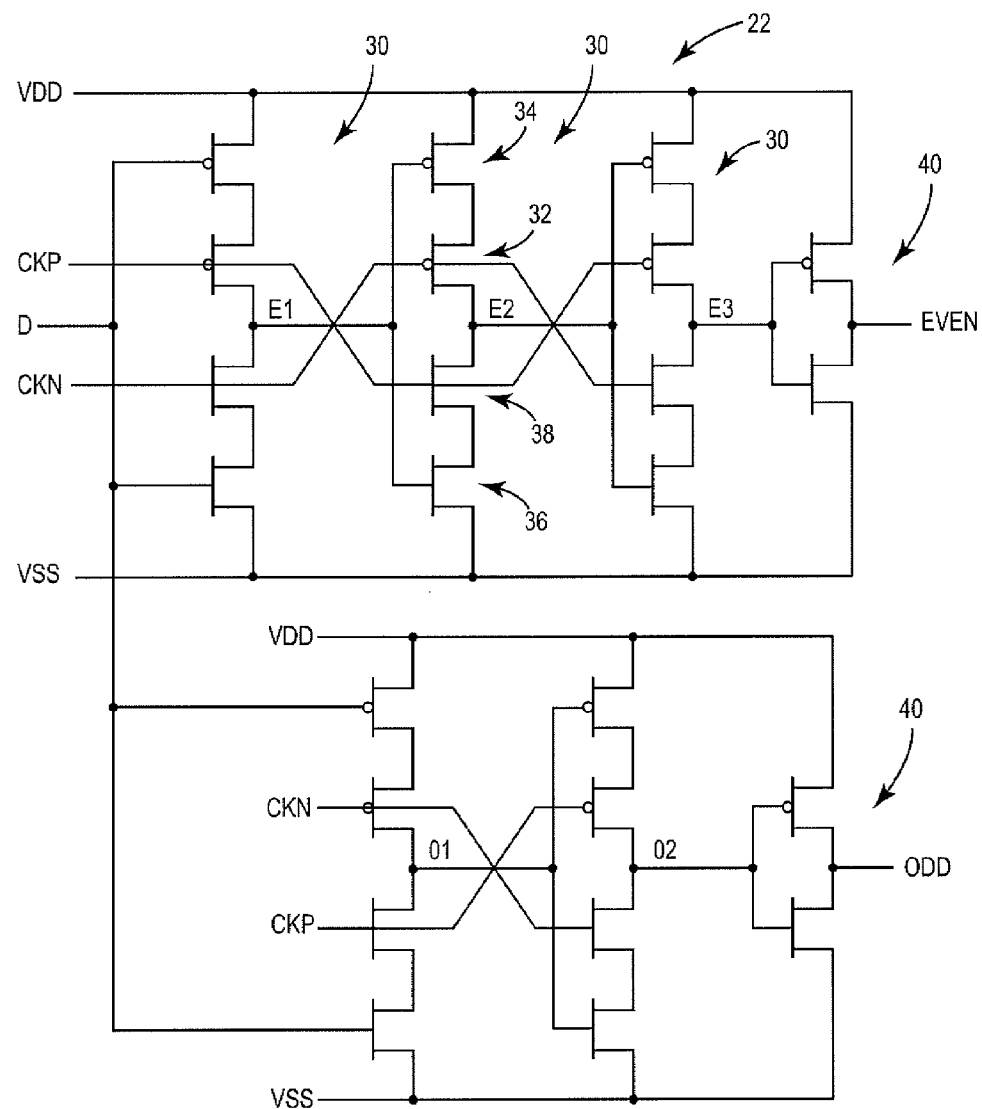
FIG. 4 is a functional schematic diagram of an alternative sampler cell.

FIG. 4 depicts another embodiment of the sampler cell 22, in which the transistors 32, 38 to which clock signals are applied are located in the center of the transistor stack, and the transistors 34, 36 inverting a data signal are located next to the VDD and VSS nodes. This arrangement places the higher-frequency sampling clock signal 26 in the center. Standard practice in CMOS designs is to arrange transistors that switch at higher frequency in the center of a transistor stack.

The clocked inverter 30 does not include any feedback, such as cross-coupled gates, to form a memory element. Alone, each clocked inverter 30 cannot store the state of a signal. However, when connected in series as shown in FIGS. 2-4, each clocked inverter 30 effectively acts as a S&H cell by utilizing the input capacitance of the following inverter 30 to store a logic level while its output is at a high impedance state. When connected in this configuration, each clocked inverter 30 inverts its input—and hence may change its output—during one phase of the sampling clock 26, and retains a logic state at its output during the other phase of the sampling clock 26. Accordingly, each clocked inverter 30, when so configured, operates as a transparent latch with an inverting output. As known in the art, cascading transparent latches that operate on opposite phases of a clock implements a "master-slave" flip flop function.

Figure 5:
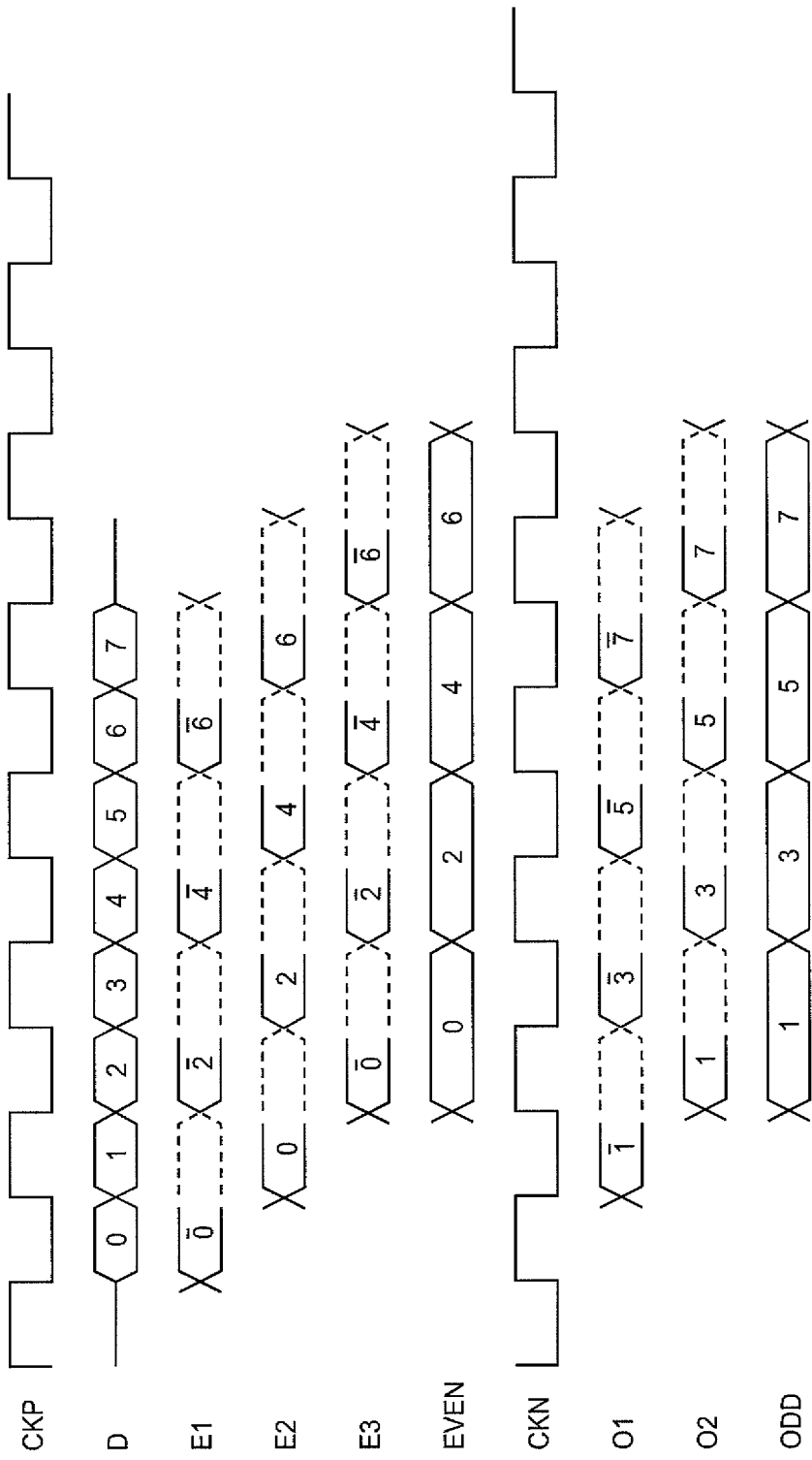
FIG. 5 is a timing diagram depicting the operation of the sampler cells of FIGS. 2-4.

FIG. 5 is a timing diagram depicting the operation of the sampler cell 22. The input signal D is depicted as having a unique—and unknown—input value during every half-cycle of the sampling clock 26. These states are depicted as numbers 0-7 in FIG. 5. Note that the numbers to not reflect multi-bit values, such as on a data bus, but rather the state of the input signal D. Any of the depicted states 0-7 could contain a state transition, or edge. The state of the input at the operative edge of the sampling clock 26 is what is captured—without metastability issues—in the first stage of series-connected clocked inverters 30.

The output of the first clocked inverter on the "even" branch, denoted E1, inverts the state of the input signal D during each low phase of the positive sampling clock CKP, the first one denoted in FIG. 5 as "zero bar." During the succeeding high phase of the positive sampling clock CKP, this value is retained at the node E1 by having charged the input capacitance of transistors in the following clocked inverter 30 (the output of the first clocked inverter 30 being at a high impedance state), as indicated in FIG. 5 by the dashed lines. Also during this sampling clock phase (the high phase of CKP), the input signal D has the state denoted by the numeral 1, and the state at node E1 is inverted at the output E2, as the clock signals are reversed at the second clocked inverter 30 as compared to the first. At the next low phase of CKP, the current state of the input signal D, denoted as 2, is inverted at the node E1, and the state 0 is inverted at the node E3. The final inverter 40 provides the input capacitance to hold the state of the signal at node E3 during the positive phase of CKP, and inverts the state at the EVEN output.

In similar fashion, the "odd" samples 1-7 are captured and propagated through the odd branch of the sampler cell 22 and presented (inverted) at the ODD output 40. The state of the input signal D is sampled at each half-cycle of the sampling clock 26, and is presented at either the EVEN or ODD output of the sampler cell 22 for a full period of the sampling clock 26. The frequency of the sampled signal is thus halved, and split from a single input to two parallel outputs. In a practical sampler circuit 20, sampler cells 22 may be serially connected in stages, with each successive stage including twice the number of sampler cells 22, in parallel, as the preceding stage, and with each successive stage clocked at half the sampling frequency of the preceding stage.

Figure 6:
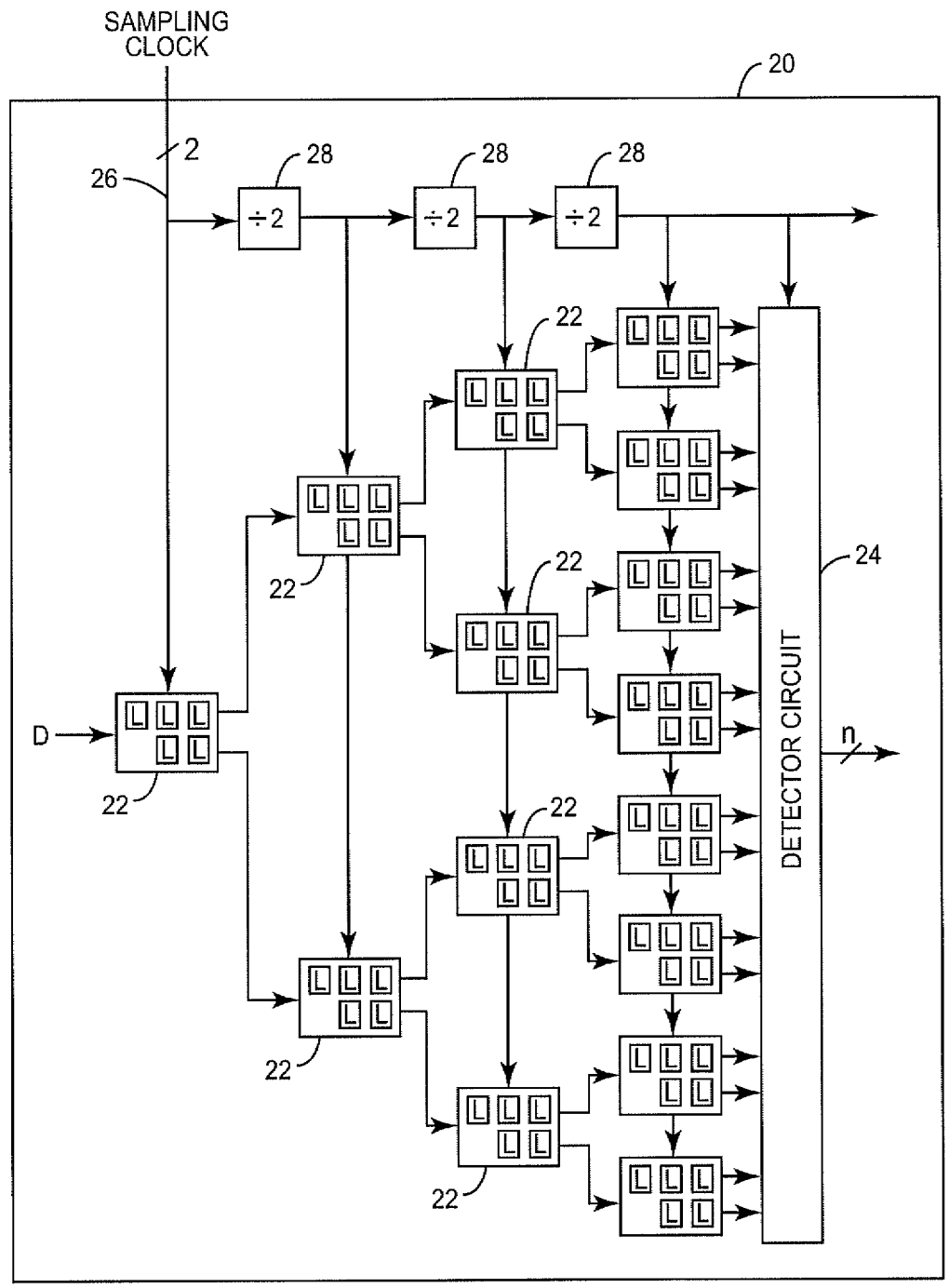
FIG. 6 is a functional block diagram of a sampler circuit.

FIG. 6 depicts a sampler circuit 20 including four stages of sampler cells 22, with each stage doubling the number of sampler cells 22 and halving the frequency of the sampling clock 26. As mentioned above, when cascaded as depicted in FIGS. 2, 3, and 4, the clocked inverters 30 operate as transparent latches with inverting outputs. This is indicated by the letter L on each clocked inverter 30 in FIG. 6.

Figure 7:
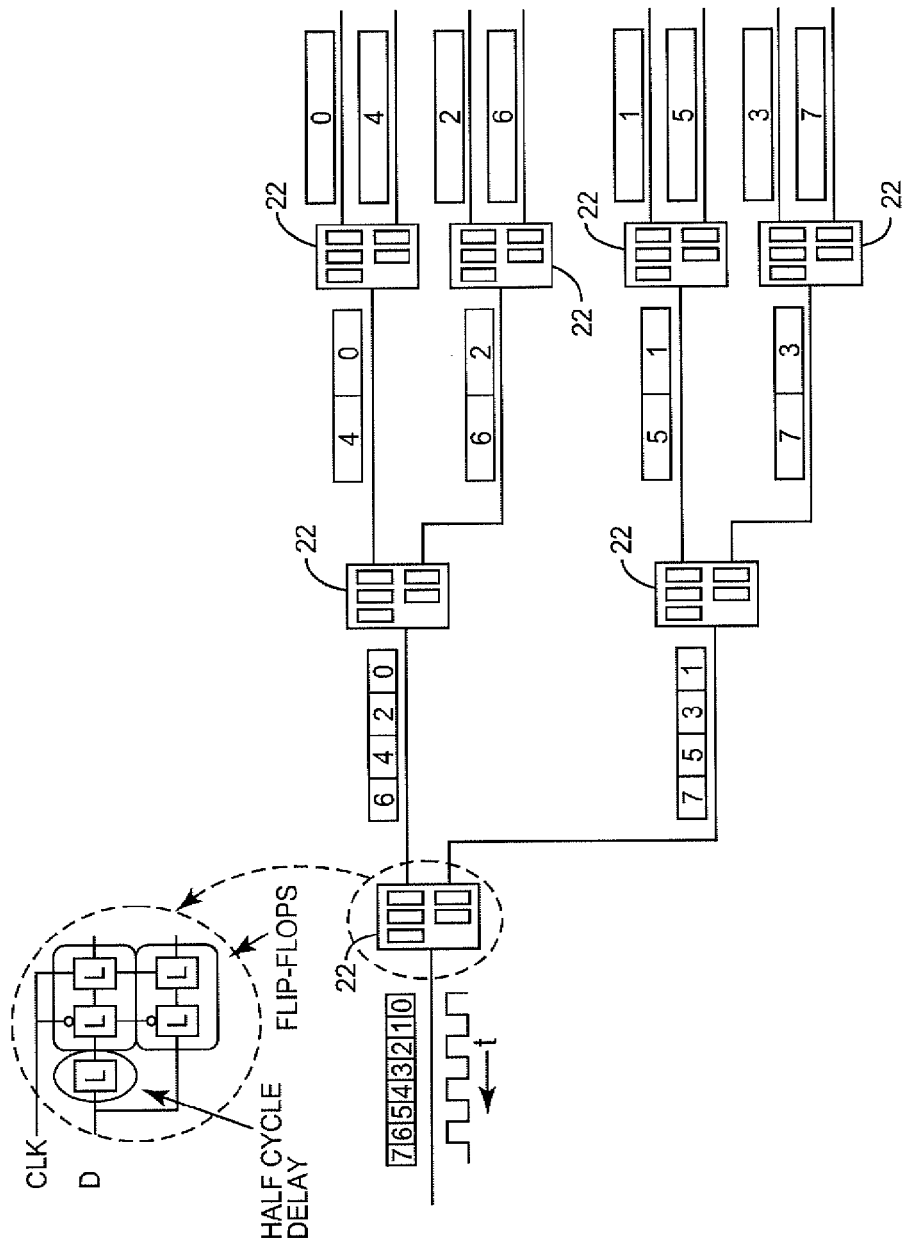
FIG. 7 is a functional block diagram of sampler cells depicting the d-multiplexing and parallelization of input samples.

FIG. 7 depicts the first three stages of sampler cells 22 from the sampler circuit 20 of FIG. 6. FIG. 7 details how the state of the input signal D at sampling times 0-7 is captured, amplified, parallelized, and reduced in frequency at each successive stage. States of the input signal are depicted using the numerals "0" to "7", in the temporal order as presented to the first stage of sampler cell 22 (that is, with earlier signal states to the right and later signal states to the left, as indicated by the CKP signal and time direction indicator). As indicated by the duration of input signal states in FIG. 7, at each successive stage of sampler cells 22, the applied sampling clock is half the frequency that applied to the previous stage, and the number of sampler cells 22 in the stage is doubled. In this example, in three stages of sampler cells 22, eight states of the original input signal are fully demultiplexed at the outputs of the last stage.

FIG. 7 also depicts how the clocked inverters 30 of the sampler cell 22, when considered as transparent latches, form the functionality of two parallel flip-flops, with an additional latch on the "even" branch. However, unlike conventional latches or flip-flops, the clocked inverters 30 have no internal feedback paths, no "decision making" or regenerative gain, and hence no susceptibility to metastability. Whatever state is present in the D input at an edge of the sampling clock 26—even one of exceedingly small amplitude—is captured and propagated through the "even" or "odd" branch of the sampler cell 22 until its value reaches a full logic-0 or logic-1 level. The sampler cells 22 of embodiments of the present invention sample, hold, and amplify the state of an applied input signal. In practice, the clocked inverters 30 will not be driven with small signals, thus completely ruling out any meta-stability problem inside the effective digital flip-flop formed by serially connecting clocked inverters 30. Hence, embodiments of the inventive sampler cell 22 substantially eliminate meta-stability issues, by design.

FIG. 7 further illuminates the logic that may be included in the detector circuit 24 in various embodiments. To recreate the state of the sampled signal D, the outputs may simply be reordered to place them in chronological order, with additional inverters as required to account for the inversion of signals along the "odd" branches of the sampler cells 22 (the inversion of states in the "odd" branches are not indicated in FIG. 7). If the goal is only to detect an edge or transition of the input signal, the outputs may be ORed (or NORed) together. The period of the input signal may be determined by counting the number of logic-0 or logic-1 values (after inverting the "odd" outputs), or by measuring the duration (e.g., with a counter) and accounting for the halving of the sampling clock 26 frequency at each stage. Other useful functions of the detector circuit 24 will be readily apparent to those of skill in the art, given the present disclosure.

Figure 8:
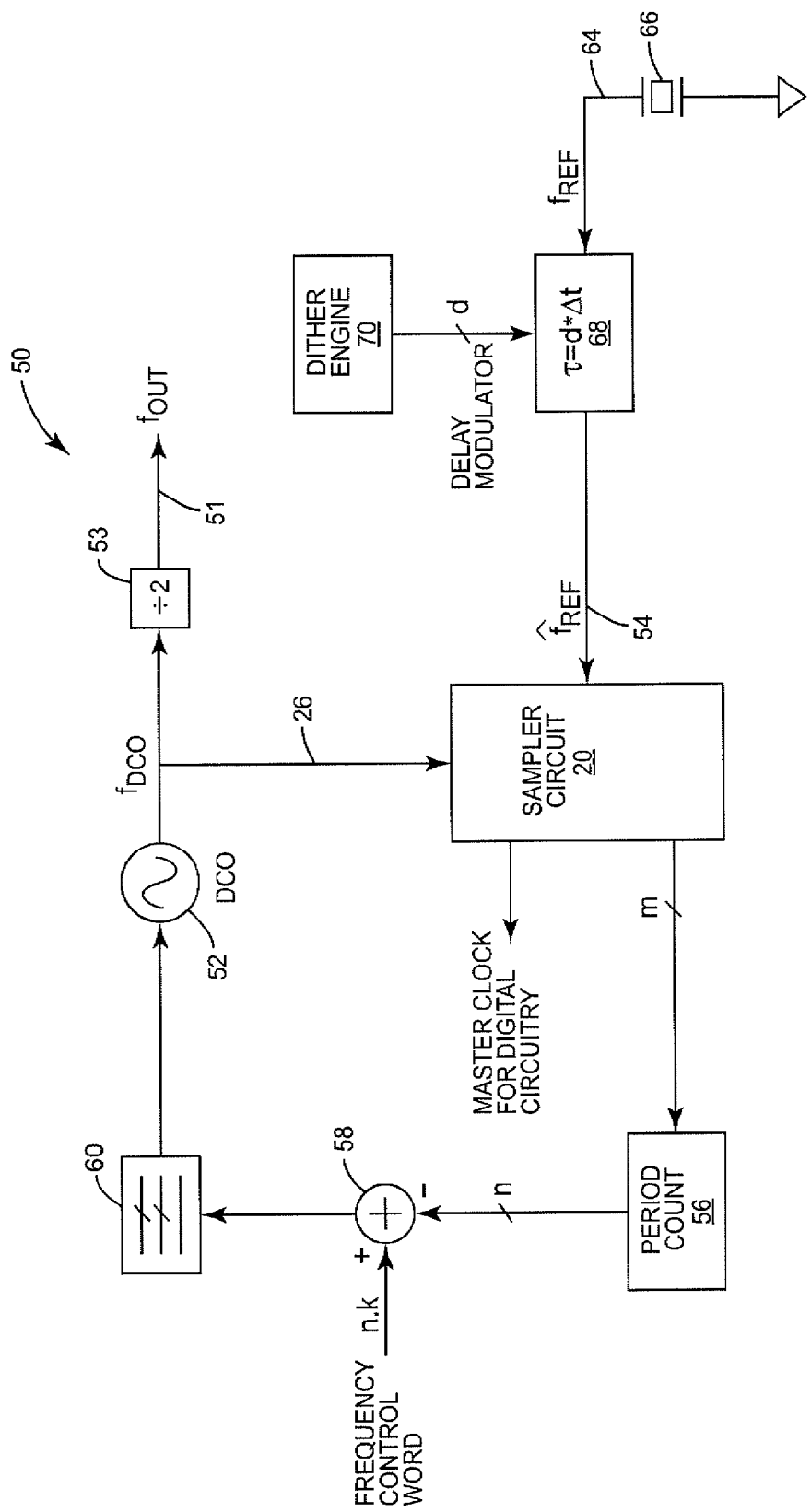
FIG. 8 is a functional block diagram of a digital phase locked loop employing the sampler circuit of FIG. 6.

FIG. 8 depicts a digital PLL (DPLL) 50, in which the inventive sampler circuit 20 is used to sample the reference clock signal with a DCO-derived clock. The DPLL 50 includes a Digitally Controlled Oscillator (DCO) 52, the sampler circuit 20 (depicted in detail in FIG. 6), reference clock $f_{REF}$ 54, period counting circuit 56, difference circuit 58, and loop filter 60. The DPLL 50 output signal 51 at frequency $f_{OUT}$ is, for example, half the DCO 52 output signal 62 frequency $f_{DCO}$ (divided in clock divider circuit 53). The DPLL 50 is based on sampling the reference clock $f_{REF}$ with the DCO clock $f_{DCO}$. The DPLL 50 is conceptually a frequency domain PLL, controlling a DCO 52. All computations are performed on the frequency rather than the phase.

In greater detail, the DCO 52 generates an output DCO clock 26 at frequency $f_{DCO}$. The DCO clock $f_{DCO}$ 26 is the sampling clock to the sampler circuit 20, which samples a randomized reference clock signal 54 having a frequency $\hat{f}_{REF}$. To generate the randomized reference clock signal 54, a reference clock signal 64 is generated from a reference clock source 66, such as a crystal oscillator. The position of transition edges of the reference clock signal 64 are randomized by a variable delay circuit 68, receiving delay modulator data from a dither engine 70. Randomizing transition edges of the reference clock signal 54 prevents spurious emissions resulting from the accumulation of quantization errors in the frequency determination and comparison operations. Over the long term, $\hat{f}_{REF}=f_{REF}$; only the transition edges are randomized.

The D input to the sampler circuit 20 (see FIG. 6) is the randomized reference clock signal 54 having a frequency $\hat{f}_{REF}$. This clock is sampled using the DCO clock $f_{DCO}$ 26 as the sampling clock. In a wireless transceiver, the usual choice for DCO frequency is twice the required Local Oscillator (LO) frequency, an oversampling rate of 2× (as 2*LO is convenient to generate quadrature signals). In this embodiment, the reference clock can be sampled with $0.5*T_{DCO}$ resolution. The sampler circuit 20 detects transition edges of the randomized reference clock signal 54, and outputs this information from the detector circuit 24.

In the DPLL 50, a period counting circuit 56 receives the edge detection information from the sampler circuit 20, and determines the period (and hence frequency) of the randomized reference clock signal 54. This value is compared to a frequency control word at subtractor 58, and an error signal is low-pass filtered by loop filter 60, and input to the DCO 52. Further details of the DPLL 50 are contained in the above-referenced, co-pending patent application.

Figure 9:
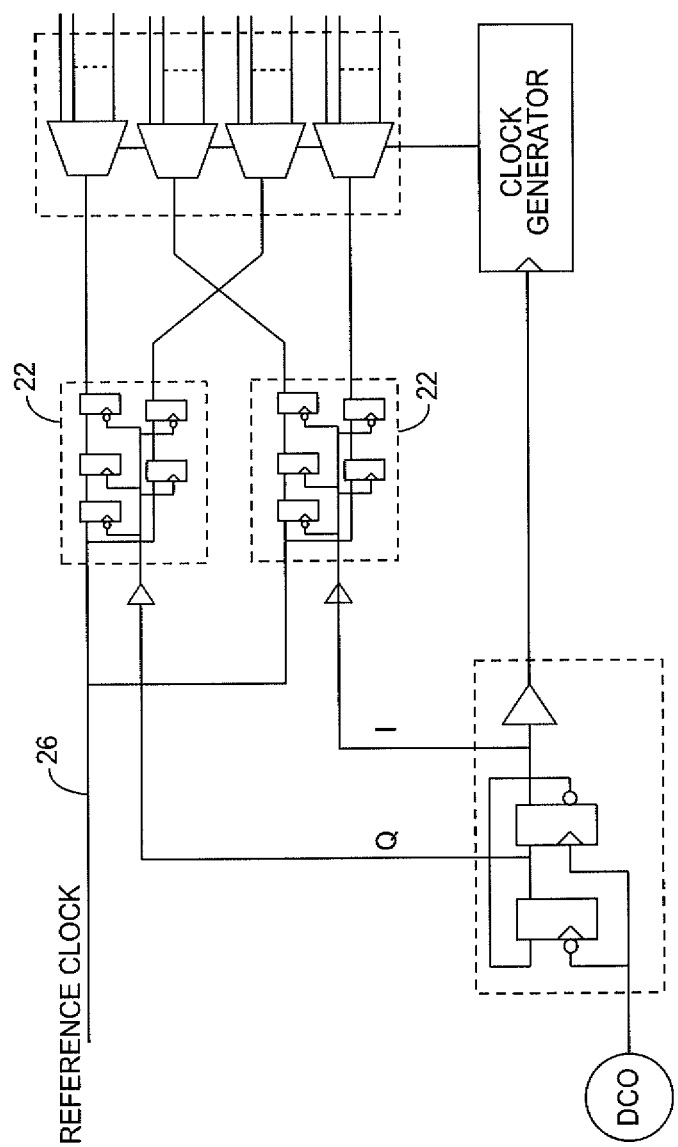
FIG. 9 is a functional block diagram of a four-phase sampler circuit.

FIG. 9 depicts an embodiment of a DPLL in which a four-phase sampler circuit is driven by quadrature clocks—i.e., In-phase (I) and Quadrature (Q) clock signals having a 90 degree relative phase shift. In this embodiment, two sampler cells 22 are arranged in parallel, sampling the input signal into four parallel outputs, odd/even on the I-channel and odd/even on the Q-channel. These four outputs are further processed by a chain of sampler cells 22, forming a de-serializer or de-multiplexer, running at a lower speed. That is, the four blocks to the right in FIG. 9 are constructed similarly to the sampler circuit 20 depicted in FIG. 6. Those of skill in the art will readily recognize that any poly-phase sampler circuit may be constructed similarly (e.g., eight-phase).

Those of skill in the art will also readily recognize that the inventive sampler circuit may be operated with any plurality of phases of a DCO (derived) clock, converting the input signal into a plurality of parallel outputs. For example, a multi-phase Delay Locked Loop (DLL) can generate a plurality of phases of a DCO (derived) clock to drive the sampler cells 22. Accordingly, the sampler cell 22 may be considered as a form of serial-to-parallel converter.

Figure 10:
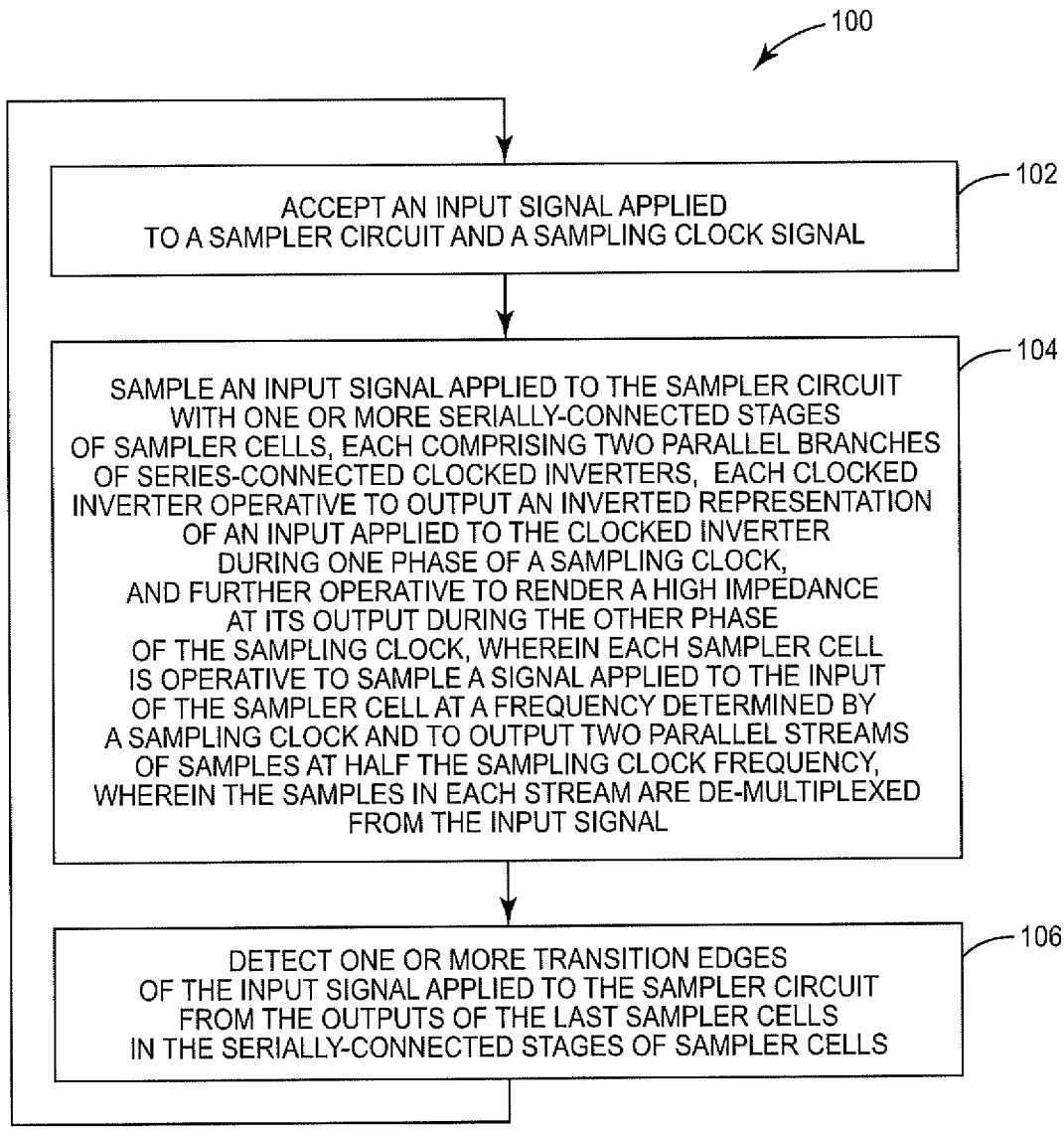
FIG. 10 is a flow diagram of a method of sampling a signal.
Figure 11:
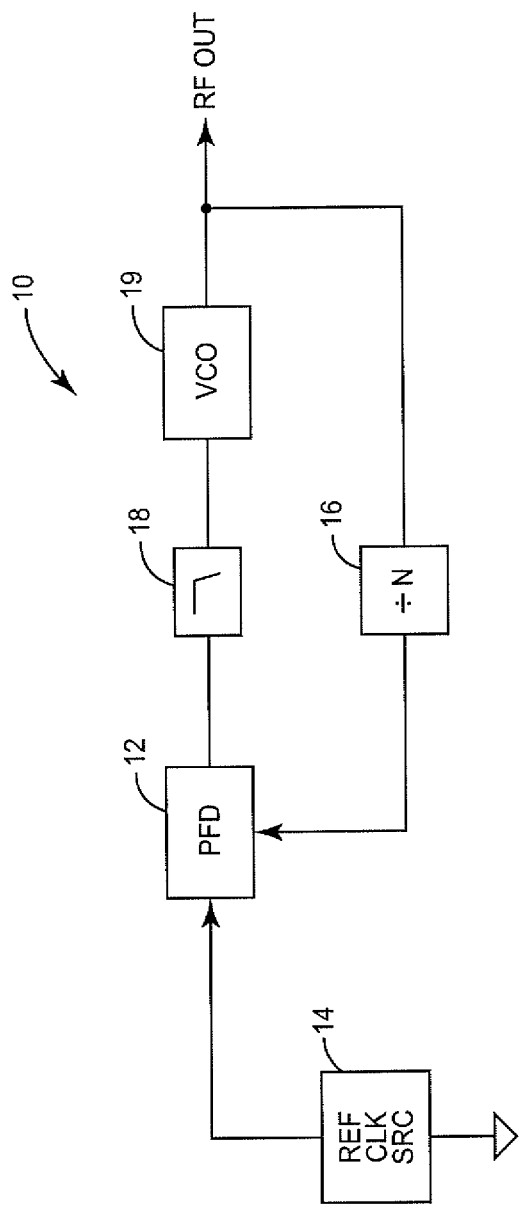
FIG. 11 is a functional block diagram of a prior art analog phase locked loop.

FIG. 10 depicts a method 100 of detecting a transition edge of an input signal. Those of skill in the art will recognize that a sampling operation is continuous and ongoing. However, the method may be said to "begin" at step 102, in which an input signal applied to a sampler circuit 20 is accepted, along with a sampling clock signal 26. At step 104, the input signal applied to the sampler circuit 20 is sampled with one or more serially-connected stages of sampler cells 22, each sampler cell 22 comprising two parallel branches of series-connected clocked inverters 30. Each clocked inverter 30 is operative to output an inverted representation of an input applied to the clocked inverter 30 during one phase of a sampling clock, and further operative to render a high impedance at its output during the other phase of the sampling clock. Each sampler cell 22 is operative to sample a signal applied to the input of the sampler cell 22 at a frequency determined by a sampling clock 26, and to output two parallel streams of samples at half the sampling clock 26 frequency, wherein the samples in each stream are de-multiplexed from the input signal. In step 106, one or more transition edges of the input signal applied to the sampler circuit 20 are detected from the outputs of the last sampler cells 22 in the serially-connected stages of sampler cells 22. The method 100 then continues with step 102.

As discussed above, embodiments of the present invention provide an effective Sample & Hold, or transparent latch functionality, without susceptibility to metastability problems. Embodiments of the present invention also exhibit high power efficiency. The main power dissipation of the sampler cell 22 is in the clock tree, driving the clock transistors 32, 38 of the clocked inverters 30. Due to the de-multiplexing action (odd/even output streams), the clock for each progressive stage is halved, reducing the required power at each stage. Meanwhile, the data path of the sampler only consumes power if the input signal changes state, and even then only during the transition. During the steady-state high or low period of the input signal, no energy is used to charge/discharge the sampling capacitances.

The present invention may, of course, be carried out in other ways than those specifically set forth herein without departing from essential characteristics of the invention. The present embodiments are to be considered in all respects as illustrative and not restrictive, and all changes coming within the meaning and equivalency range of the appended claims are intended to be embraced therein.

What is claimed is:

1. A sampler circuit operative to detect one or more transition edges of an input signal applied to the sampler circuit, comprising:
   a signal input;
   a sampling clock input;
   one or more serially-connected stages of sampler cells, each comprising:
      two parallel branches of series-connected clocked inverters, each clocked inverter operative to output an inverted representation of an input applied to the clocked inverter during one phase of a sampling clock, and further operative to render a high impedance at its output during the other phase of the sampling clock; and
      wherein the clocked inverters in each branch are alternatively clocked by the sampling clock and an inverted sampling clock;
   wherein each sampler cell is operative to sample a signal applied to the input of the sampler cell at a frequency determined by the sampling clock, and to output two parallel streams of samples at half the sampling clock frequency, the samples in each stream being de-multiplexed from the input signal; and
   a detector circuit operative to detect, from the outputs of the last sampler cells in the serially-connected stages of sampler cells, one or more transition edges of a signal applied to the sampler cell input.

2. The circuit of claim 1 wherein a first branch of series-connected clocked inverters comprises three clocked inverters and a second branch comprises two clocked inverters.

3. The circuit of claim 1 wherein each successive serially-connected stage of sampler cells comprises twice the number of sampler cells as the previous stage, and is clocked by a sampling clock that is half the frequency of the sampling clock of the previous stage.

4. The circuit of claim 1 wherein the detector circuit is operative to reorder the outputs of the last stage of sampler cells to reconstruct the signal applied to the input of the sampler cell.

5. The circuit of claim 1 wherein the detector circuit is operative to detect one or more transition edges of the signal applied to the input of the sampler cell by inspecting the state of the outputs of the last sampler cells.

6. The circuit of claim 5 wherein the detector circuit comprises an OR function.

7. The circuit of claim 1 further comprising a period counting circuit connected to the detector circuit and operative to determine a period of the input signal.

8. A method of detecting a transition edge of an input signal applied to a sampling circuit, comprising:
    accepting an input signal applied to the sampler circuit and a sampling clock signal;
    sampling the input signal applied to the sampler circuit with one or more serially-connected stages of sampler cells, each comprising two parallel branches of series-connected clocked inverters, each clocked inverter operative to output an inverted representation of an input applied to the clocked inverter during one phase of a sampling clock, and further operative to render a high impedance at its output during the other phase of the sampling clock, wherein each sampler cell is operative to sample a signal applied to the input of the sampler cell at a frequency determined by a sampling clock and to output two parallel streams of samples at half the sampling clock frequency, wherein the samples in each stream are de-multiplexed from the input signal; and
    detecting one or more transition edges of the input signal applied to the sampler circuit from the outputs of the last sampler cells in the serially-connected stages of sampler cells.

9. The method of claim 8 wherein sampling the input signal applied to the sampler circuit comprises, at each sampler cell, alternately sampling a signal applied to the sampler cell input in two parallel branches comprising series-connected clocked inverters.

10. The method of claim 9 wherein alternately sampling a signal in two parallel branches comprises clocking the clocked inverters in one branch with a sampling clock and clocking the clocked inverters in the other branch with an inverted sampling clock.

11. The method of claim 8 wherein sampling the input signal applied to the sampler circuit with one or more serially-connected stages of sampler cells comprises, at each successive stage, sampling the signal applied to that stage with twice the number of sampler cells as the previous stage, and clocking the sampler cells with a sampling clock that is half the frequency of the sampling clock of the previous stage.

12. The method of claim 8 wherein detecting one or more transition edges of the input signal applied to the sampler circuit from the outputs of the last sampler cells comprises logically ORing the outputs of the last sampler cells.

13. A four-phase sampler circuit operative to detect one or more transition edges of an input signal applied to the four-phase sampler circuit, comprising:
    a signal input;
    a sampling clock input;
    a clock divider circuit connected to the sampling clock input and operative to generate an In-phase (I) sampling clock and a Quadrature (Q) sampling clock, wherein the Q sampling clock is 90 degrees out of phase with the I sampling clock;
    a first set of serially-connected stages of sampler cells receiving the I sampling clock and a second set of serially-connected stages of sampler cells receiving the Q sampling clock, wherein the first and second set of serially-connected stages of sampler cells are arranged in parallel, and wherein each serially-connected stage of sampler cells, comprises:
        two parallel branches of series-connected clocked inverters, each clocked inverter operative to output an inverted representation of an input applied to the clocked inverter during one phase of a sampling clock applied to the clocked inverter, and further operative to render a high impedance at its output during the other phase of the sampling clock applied to the clocked inverter; and
        wherein the clocked inverters in each branch are alternatively clocked by the sampling clock applied to the clocked inverter and the inverse of the sampling clock applied to the clocked inverter;
    wherein each sampler cell is operative to sample a signal applied to the input of the sampler cell at a frequency determined by the sampling clock applied to the sampler cell, and to output two parallel streams of samples at half the sampling clock frequency, the samples in each stream being de-multiplexed from the input signal; and
    a detector circuit operative to detect, from the outputs of the last sampler cells in the serially-connected stages of sampler cells, one or more transition edges of a signal applied to the four-phase sampler circuit input.

* * * * *